US012625181B2

(12) United States Patent
Boy et al.

(10) Patent No.: US 12,625,181 B2
(45) Date of Patent: May 12, 2026

(54) MONITORING SYSTEM FOR A MECHANICALLY DRIVEN CIRCUIT BREAKER

(71) Applicant: ABB Schweiz AG, Baden (CH)

(72) Inventors: Felix Boy, Heidelberg (DE); Arda Tueysuez, Darmstadt (DE); Sebastian Breisch, Neckarsteinach (DE); Ondrej Frantisek, Heddesheim (DE); Gianluca Cortinovis, Albino (IT); Alessandro Stucchi, Dalmine (IT)

(73) Assignee: ABB Schweiz AG, Baden (CH)

( * ) Notice: Subject to any disclaimer, the term of this patent is extended or adjusted under 35 U.S.C. 154(b) by 184 days.

(21) Appl. No.: 18/427,944

(22) Filed: Jan. 31, 2024

(65) Prior Publication Data

US 2024/0264232 A1      Aug. 8, 2024

(30) Foreign Application Priority Data

Feb. 2, 2023      (EP) ..................................... 23154779

(51) Int. Cl.
 *G01R 31/327*          (2006.01)
(52) U.S. Cl.
 CPC .................................. *G01R 31/327* (2013.01)
(58) Field of Classification Search
 CPC .................................................. G01R 31/327
 See application file for complete search history.

(56) References Cited

U.S. PATENT DOCUMENTS

| | | | |
|---|---|---|---|
| 2014/0090965 A1 | 4/2014 | Leccia et al. | |
| 2019/0148093 A1* | 5/2019 | Reuber ................... | H01H 71/10 |
| | | | 335/189 |
| 2019/0348243 A1* | 11/2019 | Chen ..................... | G01R 31/327 |

FOREIGN PATENT DOCUMENTS

| | | |
|---|---|---|
| EP | 3270398 A1 | 1/2018 |
| EP | 3693985 B1 | 11/2022 |

OTHER PUBLICATIONS

Bertolotto et al., "The future evolution of medium voltage circuit breakers: new developments and possible applications," *CIGRE 2018*, 10 pp. (2018).
European Patent Office, Extended European Search Report in European Patent Application No. 23154779.5, 7 pp. (Jul. 3, 2023).

* cited by examiner

*Primary Examiner* — Scott Bauer
(74) *Attorney, Agent, or Firm* — Fitch Even Tabin & Flannery LLP

(57)          ABSTRACT

A monitoring system for a mechanically driven circuit breaker that includes fixed and moveable contacts, and a main actuator, wherein the moveable contact is selectively spaced from the fixed contact, and wherein the main actuator transitions the circuit breaker between states, the monitoring system comprising an actuation device; a sensor; and a processing unit. The actuation device applies a micro-motion to the actuator without the circuit breaker transitioning states; wherein the sensor acquires sensor data associated with the application of the micro-motion; wherein the sensor provides sensor data to the processing unit; and wherein the processing unit determines whether the circuit breaker has a fault using the sensor data.

15 Claims, 16 Drawing Sheets poles main shaft

Closing
shaft
50

Opening
shaft
60

Main actuator
10

Closing shaft 50

Opening shaft 60

Main actuator 10

MONITORING SYSTEM FOR A MECHANICALLY DRIVEN CIRCUIT BREAKER

CROSS-REFERENCE TO RELATED APPLICATIONS

The instant application claims priority to European Patent Application No. 23154779.5, filed Feb. 2, 2023, which is incorporated herein in its entirety by reference.

FIELD OF THE DISCLOSURE

The present invention relates to monitoring system for a mechanically driven circuit breaker, and monitoring methods for a mechanically driven circuit breaker.

BACKGROUND OF THE INVENTION

Mechanically driven circuit breakers are systems that can have a very long lifetime, but which might only be seldomly used. They can suffer from different failure cases, for example due to corrosion or bearing grease degradation.

FIG. 1 shows an example of a mechanically driven circuit breaker system, with FIG. 2 showing a schematic representation of the circuit breaker of FIG. 1.

As shown in FIGS. 1-2, a three phase circuit breaker system is shown, where there are three poles. There can however only be one pole. A main actuator 10 engages with a main shaft of the circuit breaker system to activate the poles to close and indeed also to open. A closing shaft 60 is activated to enable the main actuator to engage with the main shaft to transition to circuit breaker poles (or pole) from an open orientation to a closed orientation, where movable contacts (or contact) is brought into contact with fixed contacts (or contact). An opening shaft 60 is activated to enable the main actuator to engage with the main shaft to transition to circuit breaker poles (or pole) from a closed orientation to an open orientation, where movable contacts (or contact) is separated from the fixed contacts (or contact).

One failure that can occur is the jamming of the opening shaft 60 and/or closing shaft 50 in the main actuator 10. This failure is critical to the system reliability and security as it prevents the entire device from operating.

BRIEF SUMMARY OF THE INVENTION

Therefore, it would be advantageous to have an improved technique to stop a main actuator of a circuit breaker from affecting the performance of the circuit breaker.

In a first aspect, there is provided a monitoring system for a mechanically driven circuit breaker. The circuit breaker comprises a fixed contact and a movable contact and a main actuator. In a first state of the circuit breaker the moveable contact is spaced from the fixed contact and in a second state of the circuit breaker the moveable contact is in contact with the fixed contact. The main actuator is configured to transition the circuit breaker from the first state to the second state. The monitoring system comprises:

an actuation device;

at least one sensor; and a processing unit,

The actuation device is configured to apply a micro-motion to a part of the main actuator involved in transitioning the circuit breaker from the first state to the second state without the circuit breaker transitioning from the first state to second state. The at least one sensor is configured to acquire sensor data associated with the application of the micro-motion to the part of the main actuator. The at least one sensor is configured to provide the sensor data to the processing unit. The processing unit is configured to determine if the circuit breaker has a fault. The determination if the circuit breaker has a fault comprises utilization of the sensor data.

BRIEF DESCRIPTION OF THE SEVERAL VIEWS OF THE DRAWING(S)

Figure 14:
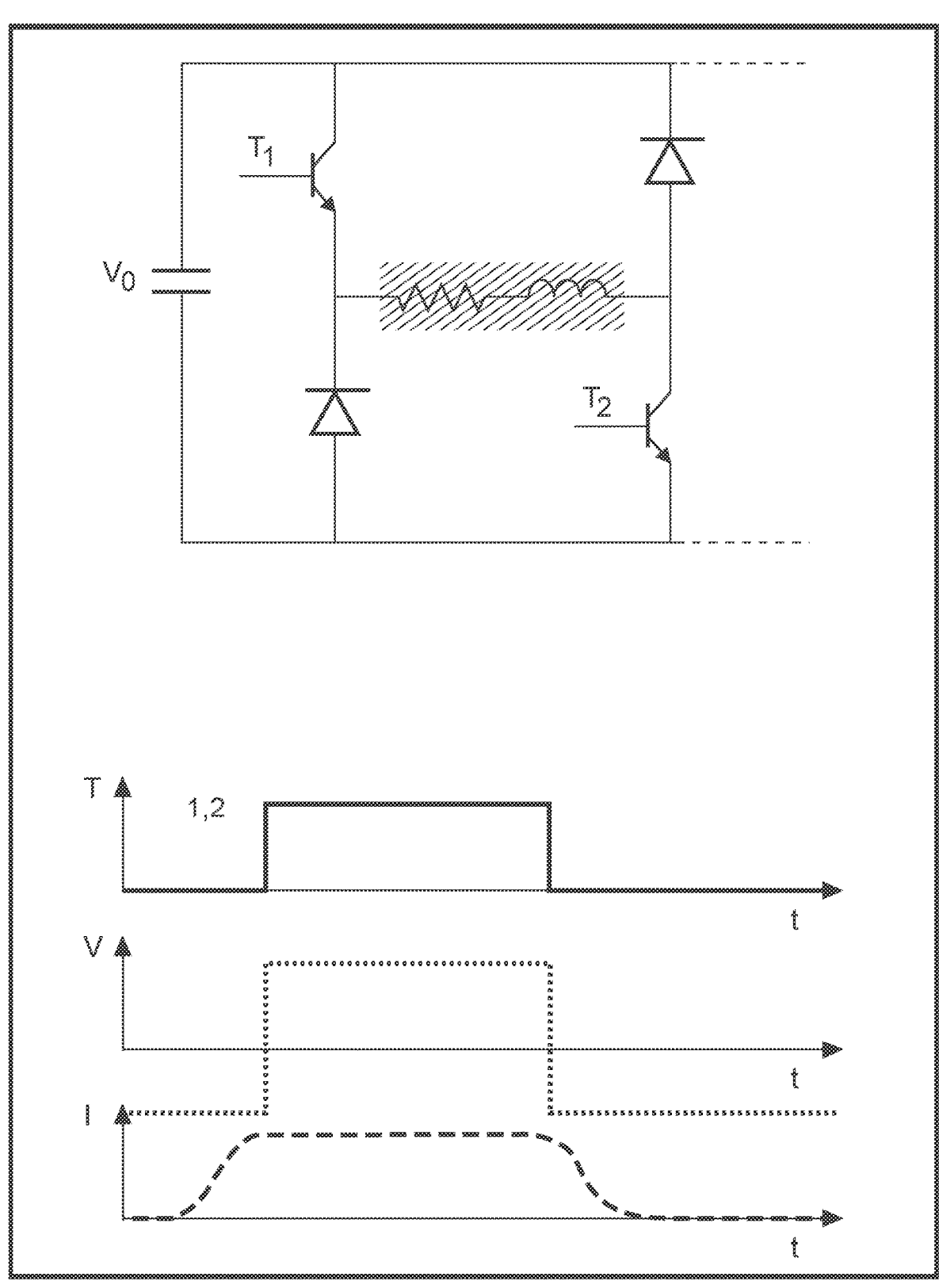
Figure 15:
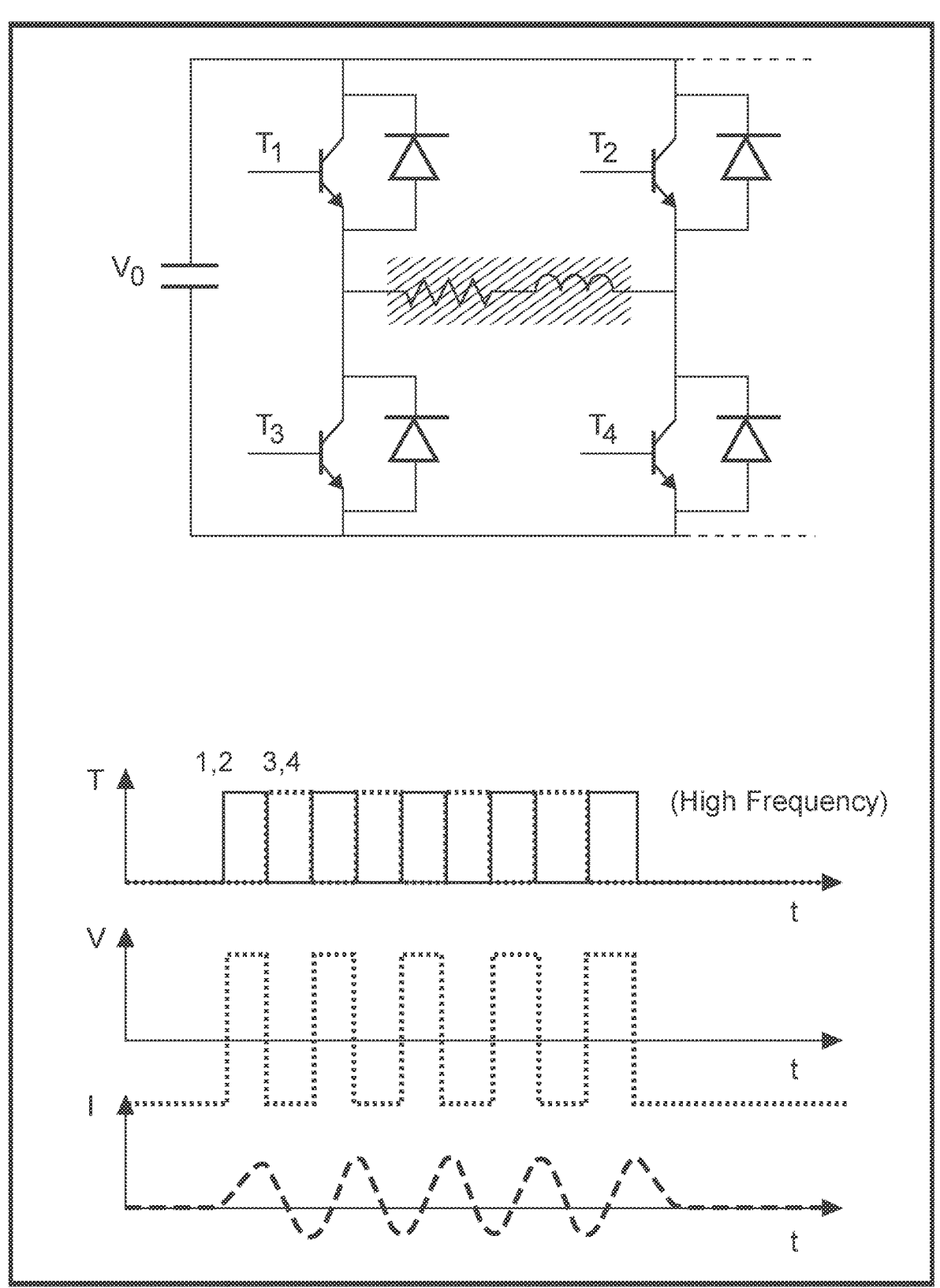

FIG. 14 shows a design for control of an actuator device with switching positive and negative voltages and with 2 transistor and 2 diodes per phase in accordance with the disclosure FIG. 15 shows a design for control of an actuator device with switching positive and negative voltages and currents with 4 transistors and 4 diodes per phase in accordance with the disclosure.

Figure 16:
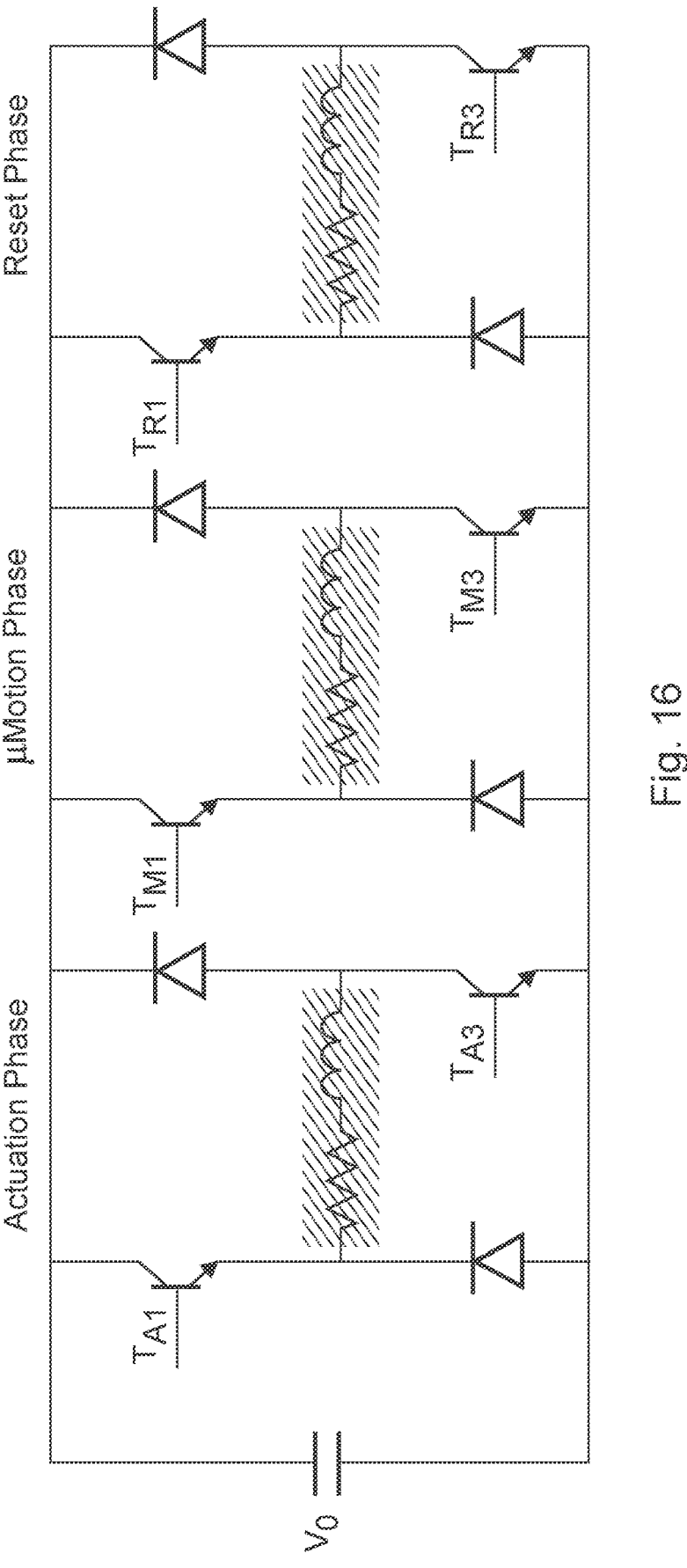

FIG. 16 shows an exemplary electronic unit for 3 phases with H-bridges including 2 transistors and 2 diodes, with the 3 coils of 3 actuator devices of the monitoring system shown in the middle as horizontal elements.

DETAILED DESCRIPTION OF THE INVENTION

FIGS. 3-16 relate to the new monitoring system for a mechanically driven circuit breaker and monitoring methods for a mechanically driven circuit breaker.

An exemplar monitoring system for a mechanically driven circuit breaker is now described. The circuit breaker comprises a fixed contact and a movable contact and a main actuator 10. In a first state of the circuit breaker the moveable contact is spaced from the fixed contact and in a second state of the circuit breaker the moveable contact is in contact with the fixed contact. The main actuator (10) is configured to transition the circuit breaker from the first state to the second state. The monitoring system comprises:

an actuation device 20;
    at least one sensor 30; and
    a processing unit 40.

The actuation device 20 is configured to apply a micro-motion to a part 50 of the main actuator 10 involved in transitioning the circuit breaker from the first state to the second state without the circuit breaker transitioning from the first state to second state. The at least one sensor 30 is configured to acquire sensor data associated with the application of the micro-motion to the part 50 of the main actuator. The at least one sensor 30 is configured to provide the sensor data to the processing unit 40. The processing unit is configured to determine if the circuit breaker has a fault. The determination if the circuit breaker has a fault comprises utilization of the sensor data.

In an example, the part 50 of the main actuator 10 is a closing shaft 50. In an example, the part 50 of the main actuator 10 is a closing hook 50. According to an example, the sensor data comprises rotational or linear movement data of the part 50 of the main actuator 10. According to an example, the sensor data comprises force and/or torque data applied to the part 50 of the main actuation 10. According to an example, the sensor data comprises force and/or torque data exerted by the actuation device 20.

In an example, the force and/or torque data exerted by the actuator device is measured with respect to at least one part 70, 80 of the actuation device 20.

According to an example, the sensor data comprises rotational or linear movement data of at least one part 70, 80 of the actuation device 20.

According to an example, the at least one part of the actuation device 20 comprises a rotor 70 of a rotational actuator or a plunger 80 of a translational actuator.

Thus, the actuation device 20 that is used to apply a micro-motion to a part 50 of the main actuator 10 can itself be a sensor in terms of force/torque information applied by it to the part 50 can be derived by appropriate measurements by a sensor/measurement system. However, additionally or alternatively separate sensors (to the actuation device) can be used to measure displacement/force/torque applied to the part 50 directly (for example displacement/force/torque sensors applied to or associated directly with the part 50) as a consequence of the application of the micro-motion via the actuator device 20.

According to an example, the determination if the circuit breaker has a fault comprises utilization of reference sensor data.

In an example, a reference circuit breaker comprises a fixed contact and a movable contact and a main actuator. In a first state of the reference circuit breaker the moveable contact is spaced from the fixed contact and in a second state of the reference circuit breaker the moveable contact is in contact with the fixed contact. A main actuator of the reference circuit is configured to transition the reference circuit breaker from the first state to the second state. A reference actuation device is configured to apply a micro-motion to a part of the main actuator involved in transitioning the reference circuit breaker from the first state to the second state without the reference circuit breaker transitioning from the first state to second state. At least one sensor is configured to acquire the reference sensor data associated with the application of the micro-motion to the part of the main actuator.

In other words, an equivalent circuit breaker system and monitoring system, to that being used in the field for actual monitoring, can be utilized in a whole series of situations where micro-motion is applied to the part of the main actuator, where the main actuator is operating correctly and indeed operating with different failures, in order that reference sensor data can be acquired for healthy operation and for unhealthy operation. In can then be determined from a comparison of the actual data acquired in the field if there is a problem or not, and indeed the actual problem can be derived. A simple comparison could be made, however a neural network could be trained on the reference sensor data, which then when provided with real in the field data can determine not only if there is a fault with the main actuator, but determine what the fault is.

In an example, the reference sensor data comprises rotational or linear movement data of the part of the main actuator of the reference circuit breaker.

In an example, the reference sensor data comprises force and/or torque data applied to the part of the main actuation of the reference circuit breaker.

In an example, the reference sensor data comprises force and/or torque data exerted by the reference actuation device.

In an example, the force and/or torque data exerted by the reference actuator device is measured with respect to at least one part of the actuation device.

In an example, the sensor data comprises rotational or linear movement data of at least one part of the reference actuation device.

In an example, the at least one part of the actuation device comprises a rotor of a rotational actuator or a plunger of a translational actuator.

An exemplar monitoring system for a mechanically driven circuit breaker is nor described. The circuit breaker comprising a fixed contact and a movable contact and a main actuator 10. In a first state of the circuit breaker the moveable contact is spaced from the fixed contact and in a second state of the circuit breaker the moveable contact is in contact with the fixed contact. The main actuator 10 is configured to transition the circuit breaker from the second state to the first state. The monitoring system comprises:

an actuation device 20;
    at least one sensor 30; and
    a processing unit 40

The actuation device 20 is configured to apply a micro-motion to a part 60 of the main actuator 10 involved in transitioning the circuit breaker from the second state to the first state without the circuit breaker transitioning from the second state to first state. The at least one sensor 30 is configured to acquire sensor data associated with the application of the micro-motion to the part 60 of the main actuator. The at least one sensor 30 is configured to provide the sensor data to the processing unit 40. The processing unit is configured to determine if the circuit breaker has a fault. The determination if the circuit breaker has a fault comprises utilization of the sensor data.

In an example, the part 60 of the main actuator 10 is an opening shaft 60.

In an example, the part 60 of the main actuator 10 is an opening hook 60.

According to an example, the sensor data comprises rotational or linear movement data of the part 60 of the main actuator 10.

According to an example, the sensor data comprises force and/or torque data applied to the part 60 of the main actuation 20.

According to an example, the sensor data comprises force and/or torque data exerted by the actuation device 20.

In an example, the force and/or torque data exerted by the actuator device is measured with respect to at least one part (60, 70) of the actuation device (20).

System according to any of claims 8-11, wherein the sensor data comprises rotational or linear movement data of at least one part (60, 70) of the actuation device (20).

System according to claim 12, wherein the at least one part of the actuation device (20) comprises a rotor 70 of a rotational actuator or a plunger (80) of a translational actuator.

Thus, the actuation device 20 that is used to apply a micro-motion to a part 60 of the main actuator 10 can itself be a sensor in terms of force/torque information applied by it to the part 60 can be derived by appropriate measurements by a sensor/measurement system. However, additionally or alternatively separate sensors (to the actuation device) can be used to measure displacement/force/torque applied to the part 60 directly (for example displacement/force/torque sensors applied to or associated directly with the part 60) as a consequence of the application of the micro-motion via the actuator device 20.

In an example, the determination if the circuit breaker has a fault comprises utilization of reference sensor data.

In an example, a reference circuit breaker comprises a fixed contact and a movable contact and a main actuator. I in a first state of the reference circuit breaker the moveable contact is spaced from the fixed contact and in a second state of the reference circuit breaker the moveable contact is in contact with the fixed contact. A main actuator of the reference circuit breaker is configured to transition the reference circuit breaker from the second state to the first state. A reference actuation device is configured to apply a micro-motion to a part of the main actuator involved in transitioning the reference circuit breaker from the second state to the first state without the reference circuit breaker transitioning from the second state to first state. At least one sensor is configured to acquire the reference sensor data associated with the application of the micro-motion to the part of the main actuator.

In other words, an equivalent circuit breaker system and monitoring system, to that being used in the field for actual monitoring, can be utilized in a whole series of situations where micro-motion is applied to the part of the main actuator, where the main actuator is operating correctly and indeed operating with different failures, in order that reference sensor data can be acquired for healthy operation and for unhealthy operation. In can then be determined from a comparison of the actual data acquired in the field if there is a problem or not, and indeed the actual problem can be derived. A simple comparison could be made, however a neural network could be trained on the reference sensor data, which then when provided with real in the field data can determine not only if there is a fault with the main actuator, but determine what the fault is.

In an example, the reference sensor data comprises rotational or linear movement data of the part of the main actuator of the reference circuit breaker.

In an example, the reference sensor data comprises force and/or torque data applied to the part of the main actuation of the reference circuit breaker.

In an example, the reference sensor data comprises force and/or torque data exerted by the reference actuation device.

In an example, the force and/or torque data exerted by the reference actuator device is measured with respect to at least one part of the actuation device.

In an example, the sensor data comprises rotational or linear movement data of at least one part of the reference actuation device.

In an example, the at least one part of the actuation device comprises a rotor of a rotational actuator or a plunger of a translational actuator.

An exemplar monitoring method for a mechanically driven circuit breaker is now described. The circuit breaker comprises a fixed contact and a movable contact and a main actuator 10. I in a first state of the circuit breaker the moveable contact is spaced from the fixed contact and in a second state of the circuit breaker the moveable contact is in contact with the fixed contact. The main actuator 10 is configured to transition the circuit breaker from the first state to the second state. The monitoring method comprises:

applying by an actuation device 20 a micro-motion to a part 50 of the main actuator 10 involved in transitioning the circuit breaker from the first state to the second state without the circuit breaker transitioning from the first state to second state;

acquiring by at least one sensor 30 sensor data associated with the application of the micro-motion to the part 50 of the main actuator;

providing by the at least one sensor 30 the sensor data to a processing unit 40;

determining by the processing unit if the circuit breaker has a fault, wherein the determining if the circuit breaker has a fault comprises utilizing the sensor data.

In an example, the part 50 of the main actuator 10 is a closing shaft 50.

In an example, the part 50 of the main actuator 10 is a closing hook 50.

In an example the sensor data comprises rotational or linear movement data of the part 50 of the main actuator 10.

In an example the sensor data comprises force and/or torque data applied to the part 50 of the main actuation 20.

In an example the sensor data comprises force and/or torque data exerted by the actuation device 20.

In an example, the force and/or torque data exerted by the actuator device is measured with respect to at least one part 70, 80 of the actuation device 20.

In an example the sensor data comprises rotational or linear movement data of at least one part 70, 80 of the actuation device 20.

In an example the at least one part of the actuation device 20 comprises a rotor 70 of a rotational actuator or a plunger 80 of a translational actuator.

In an example, the determining if the circuit breaker has a fault comprises utilizing reference sensor data.

In an example, a reference circuit breaker comprises a fixed contact and a movable contact and a main actuator. In a first state of the reference circuit breaker the moveable contact is spaced from the fixed contact and in a second state of the reference circuit breaker the moveable contact is in contact with the fixed contact. A main actuator of the reference circuit breaker is configured to transition the reference circuit breaker from the first state to the second state. A reference actuation device is configured to apply a micro-motion to a part of the main actuator involved in transitioning the reference circuit breaker from the first state to the second state without the reference circuit breaker transitioning from the first state to second state. At least one sensor is configured to acquire the reference sensor data associated with the application of the micro-motion to the part of the main actuator.

In an example, the reference sensor data comprises rotational or linear movement data of the part of the main actuator of the reference circuit breaker.

In an example, the reference sensor data comprises force and/or torque data applied to the part of the main actuation of the reference circuit breaker.

In an example, the reference sensor data comprises force and/or torque data exerted by the reference actuation device.

In an example, the force and/or torque data exerted by the reference actuator device is measured with respect to at least one part of the actuation device.

In an example, the sensor data comprises rotational or linear movement data of at least one part of the reference actuation device.

In an example, the at least one part of the actuation device comprises a rotor of a rotational actuator or a plunger of a translational actuator.

An exemplar monitoring method for a mechanically driven circuit breaker is now described. The circuit breaker comprising a fixed contact and a movable contact and a main actuator 10. In a first state of the circuit breaker the moveable contact is spaced from the fixed contact and in a second state of the circuit breaker the moveable contact is in contact with the fixed contact. The main actuator 10 is configured to transition the circuit breaker from the second state to the first state. The monitoring method comprises:

applying by an actuation device 20 a micro-motion to a part 60 of the main actuator 10 involved in transitioning the circuit breaker from the second state to the first state without the circuit breaker transitioning from the second state to first state;

acquiring by at least one sensor 30 sensor data associated with the application of the micro-motion to the part 60 of the main actuator;

providing by the at least one sensor 30 the sensor data to a processing unit 40;

determining by the processing unit if the circuit breaker has a fault, wherein the determining if the circuit breaker has a fault comprises utilizing the sensor data.

In an example, the part 60 of the main actuator 10 is an opening shaft 60.

In an example, the part 60 of the main actuator 10 is an opening hook 60.

In an example, the sensor data comprises rotational or linear movement data of the part 60 of the main actuator 10.

In an example, the sensor data comprises force and/or torque data applied to the part 60 of the main actuation 20.

In an example, the sensor data comprises force and/or torque data exerted by the actuation device 20.

In an example, the force and/or torque data exerted by the actuator device is measured with respect to at least one part 60, 70 of the actuation device 20.

In an example, the sensor data comprises rotational or linear movement data of at least one part 60, 70 of the actuation device 20.

In an example, the at least one part of the actuation device 20 comprises a rotor 70 of a rotational actuator or a plunger 80 of a translational actuator.

In an example, the determining if the circuit breaker has a fault comprises utilizing reference sensor data.

In an example, a reference circuit breaker comprises a fixed contact and a movable contact and a main actuator. In a first state of the reference circuit breaker the moveable contact is spaced from the fixed contact and in a second state of the reference circuit breaker the moveable contact is in contact with the fixed contact. A main actuator of the reference circuit breaker is configured to transition the reference circuit breaker from the second state to the first state. A reference actuation device is configured to apply a micro-motion to a part of the main actuator involved in transitioning the reference circuit breaker from the second state to the first state without the reference circuit breaker transitioning from the second state to first state. At least one sensor is configured to acquire the reference sensor data associated with the application of the micro-motion to the part of the main actuator.

In an example, the reference sensor data comprises rotational or linear movement data of the part of the main actuator of the reference circuit breaker.

In an example, the reference sensor data comprises force and/or torque data applied to the part of the main actuation of the reference circuit breaker.

In an example, the reference sensor data comprises force and/or torque data exerted by the reference actuation device.

In an example, the force and/or torque data exerted by the reference actuator device is measured with respect to at least one part of the actuation device.

In an example, the sensor data comprises rotational or linear movement data of at least one part of the reference actuation device.

In an example, the at least one part of the actuation device comprises a rotor of a rotational actuator or a plunger of a translational actuator.

The new monitoring system for a mechanically driven circuit breaker and monitoring methods for a mechanically driven circuit breaker are now described in further specified detail, where again reference is made to FIGS. 3-16.

Figure 3:
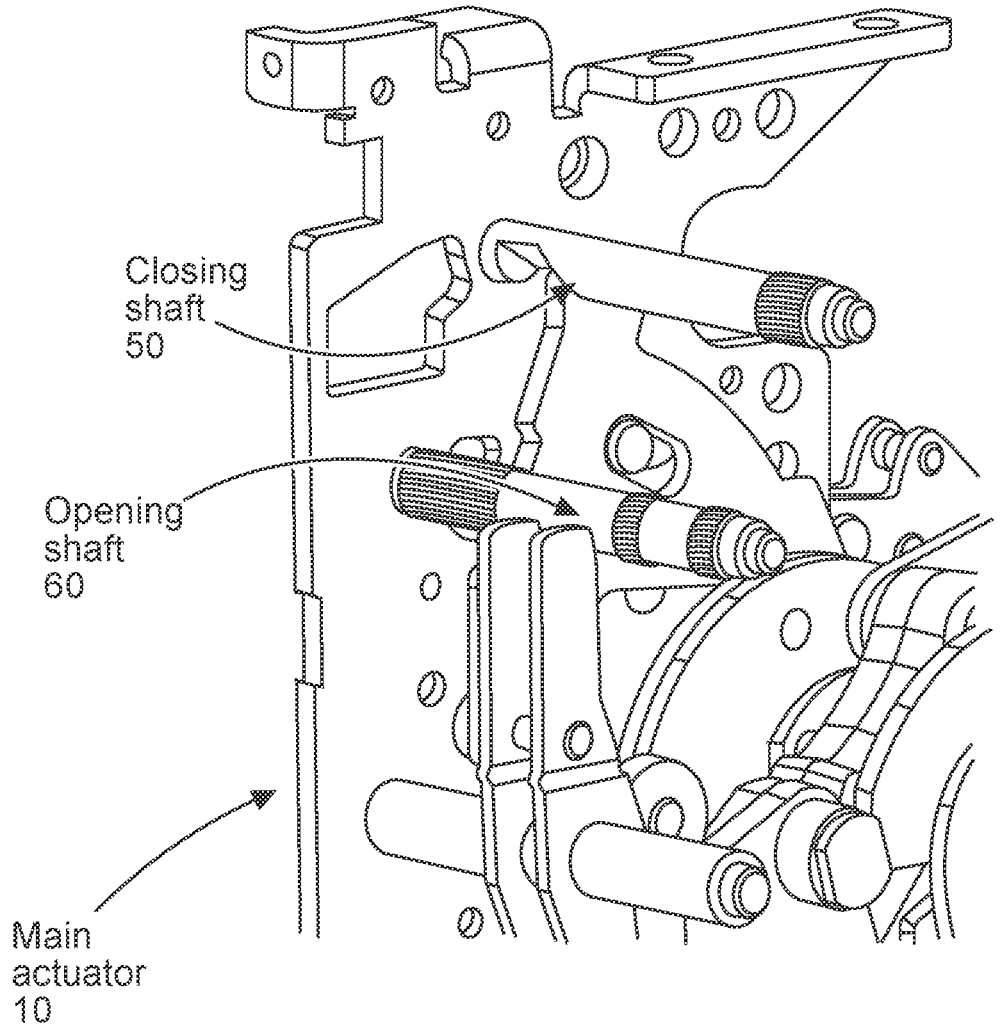
FIG. 3 shows details of a main actuator of a circuit breaker in accordance with the disclosure.

FIG. 3 shows part of a main actuator 10 of a circuit breaker or circuit breaker system that can operate one or more circuit breaker poles to close or open. The main actuator 10 has an opening shaft 50 and a closing shaft 60. The opening shaft 50 and closing shaft 60 are in effect latching elements. The opening shaft 50 when activated enables the main actuator 10 to operate a main shaft of the circuit breaker to transition the circuit breaker from a closed state to an open state. The closing shaft 60 when activated enables the main actuator 10 to operate a main shaft of the circuit breaker to transition the circuit breaker from the open state to the closed state. The opening shaft 50 and the closing shaft 60 are formed in such a way such that a micro-motion, a small rotation of the shafts, can be made without the main actuator being activated to operate the main shaft to transition the circuit breaker from the open state to the closed state or from the closed state to the open state. This is achieved by the shafts having eccentric elements that enable the shafts to be rotated by a small amount (a micro-motion) without leading to actuation of the main actuator as such. An example of such a main actuator that enables such a micro-motion to be made without actuation of the main actuator as such is described in EP3693985B1, which for a closing operation describes that the main actuator comprises a closing shaft, and a closing hook. The closing shaft has a longitudinal axis. The closing shaft comprises an interaction region at an interaction location along the longitudinal axis. The closing shaft is configured to rotate about the longitudinal axis. In a first state the closing shaft is configured to be at a first rotational position, wherein the closing hook is configured to be in contact with the interaction region such that the closing hook cannot rotate in a first rotational direction.

In a second state the closing shaft is configured to be at a second rotational position, wherein the closing hook is configured to rotate in the first rotational direction past the interaction region of the closing shaft. The main actuator is configured to transition from the first state to a third state, wherein the closing shaft is configured to rotate from the first rotational position to a third rotational position, wherein the closing hook is configured to be in contact with the interaction region such that the closing hook has been rotated in a second rotational direction opposite to the first rotational direction. A similar operation means applies for an opening operation, where the main actuator comprises an opening shaft and an opening hook. The opening shaft has a longitudinal axis. The opening shaft comprises an interaction region at an interaction location along the longitudinal axis. The opening shaft is configured to rotate about the longitudinal axis. In a first state the opening shaft is configured to be at a first rotational position, and the opening hook is configured to be in contact with the interaction region such that the opening hook cannot rotate in a first rotational direction. In a second state the opening shaft is configured to be at a second rotational position, and the opening hook is configured to rotate in the first rotational direction past the interaction region of the opening shaft. The main actuator is configured to transition from the first state to a third state. In the transition from the first state to the third state the opening shaft is configured to rotate from the first rotational position to a third rotational position, and the opening hook is configured to be in contact with the interaction region such that the opening hook has been rotated in a second rotational direction opposite to the first rotational direction.

The present monitoring system for a mechanically driven circuit breaker, and monitoring methods for a mechanically driven circuit breaker, is configured to operate with such a main actuator (and other main actuators) that enable a micro-motion of parts of the main actuator, that are associated with full actuation of the main actuator, but where the micro-motion does not actually lead to full actuation. However, by monitoring the displacement of the parts and/or force/torque applied to the parts as a consequence of applying the micro-motion it can be determined if the main actuator is performing correctly or has a defect such as corrosion or bearing grease degradation, where for example there may not be the correct magnitude of displacement, or a slower displacement that anticipated, or a greater force/torque, or indeed lesser force/torque required to be applied (or more than one of these and possible all), that can then be used to indicate that the main actuator has a fault and remedial action is required.

The monitoring system for a mechanically driven circuit breaker, and monitoring methods for a mechanically driven circuit breaker are described in further detail below.

Thus, as described above the new technique involves actively applying a small motion to the circuit breaker system, which moves the main actuator but does not switch the entire circuit breaker in order to assess whether the circuit breaker system is still healthy or not. To this end, the applied small (micro) motion is also be measured/quantified and it is evaluated if the measured motion with respect to displacement and or force and or torque, for example with respect to a certain force/torque derived from an actuator device that applies the micro-motion to declare the system to be healthy or not.

It was recognized by the inventors that for today's mechanically driven circuit breakers, it is very difficult to check whether the device is still operational after a long period of standstill or a certain part of the lifetime.

Figure 1:
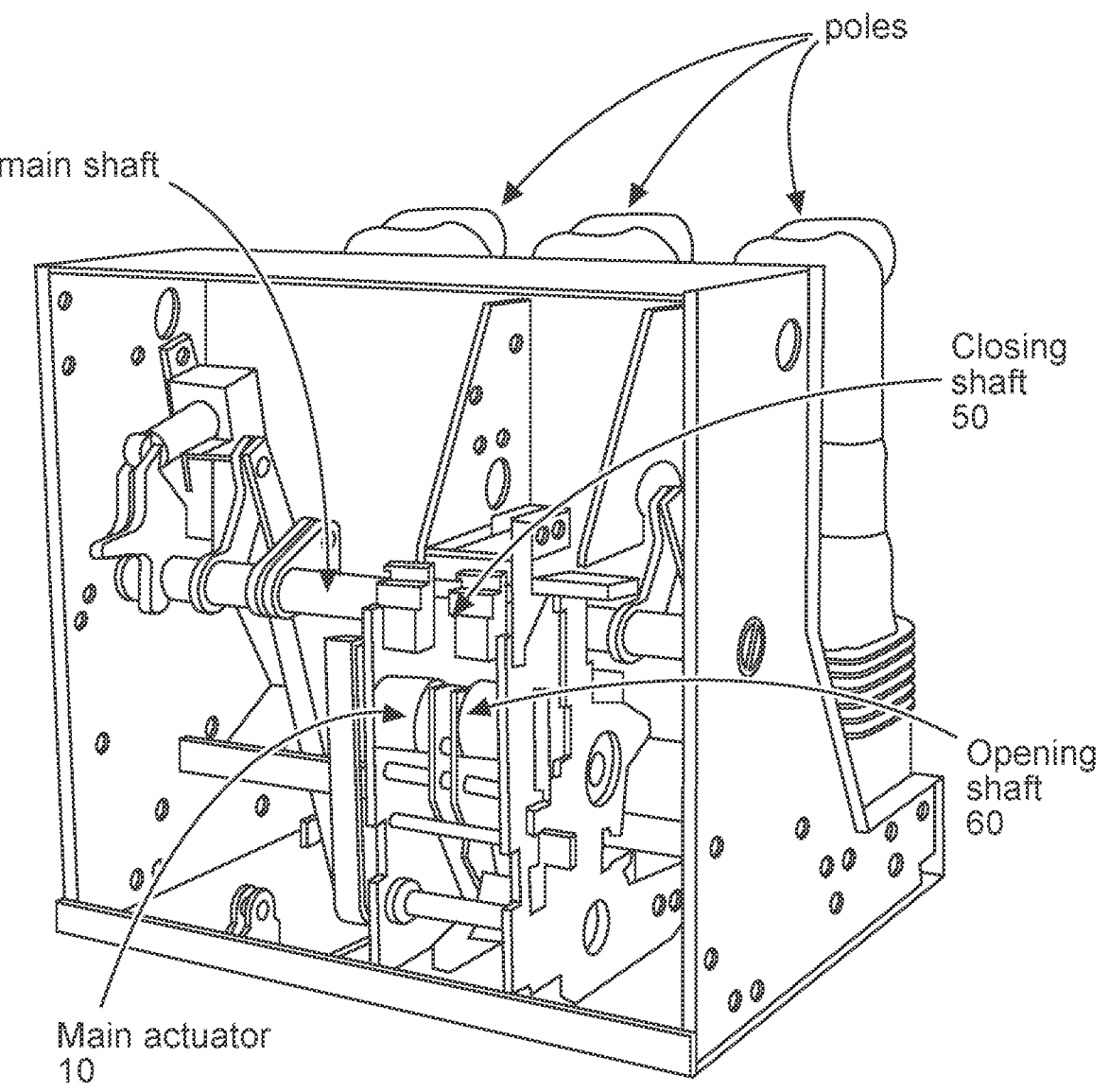
FIG. 1 shows a mechanically driven circuit breaker system with three circuit breaker poles and with the front panel removed in accordance with the disclosure.
Figure 2:
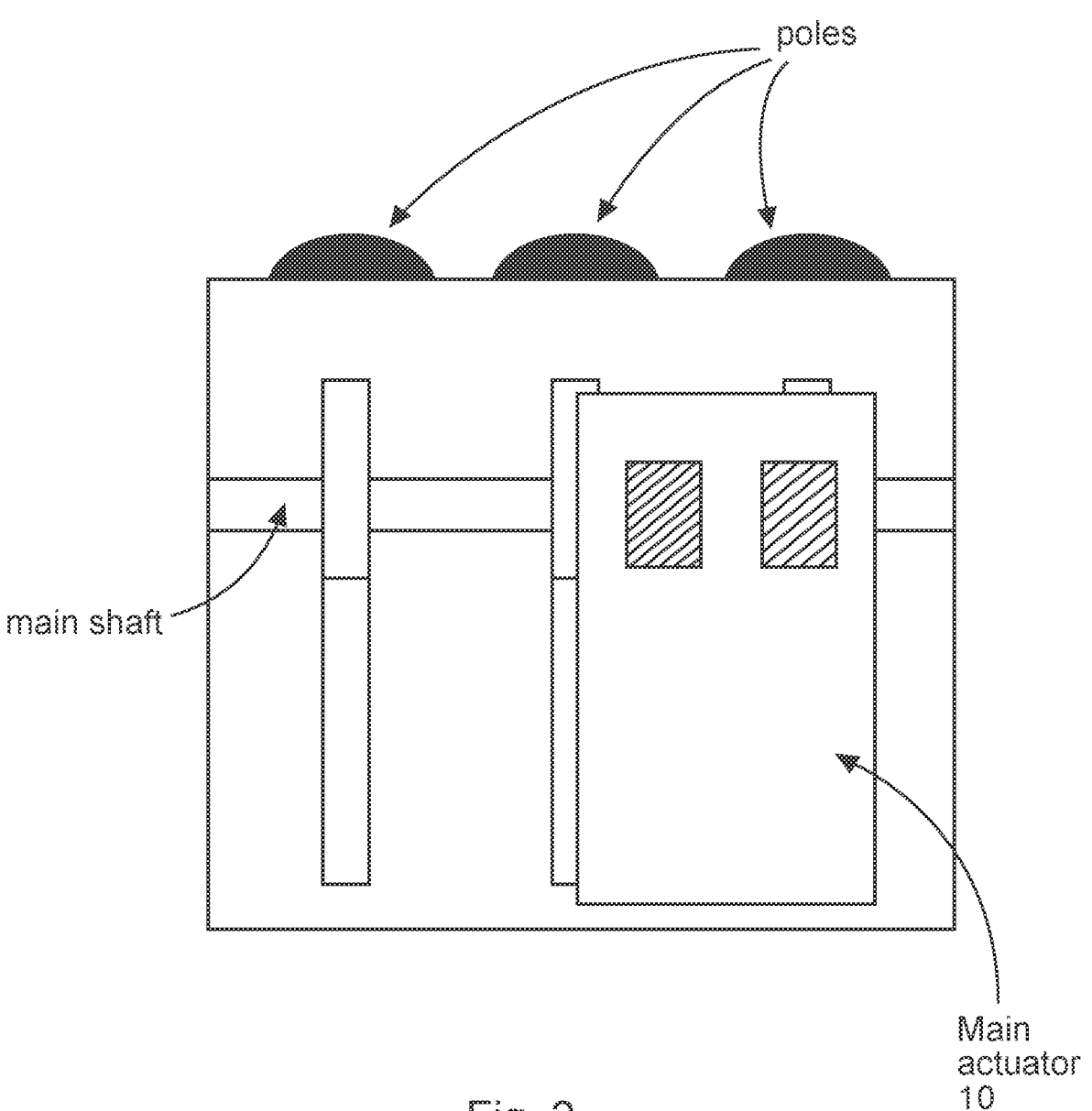
FIG. 2 shows a schematic representation of the mechanically driven circuit breaker system of FIG. 1.

From a technical point of view, these breakers are driven by a main actuator (see FIGS. 1-2). To initialize the switching, there is usually one shaft each for opening and closing. These shafts release some mechanism (for example a mechanical hook) to start the motion. A further actuation device is used to move the corresponding (opening or closing) shaft. In state-of-the-art systems, there are devices can move these shafts by a certain defined actuation angle.

The inventors realized that by applying a micro-motion to an appropriate part involved in the switching of the circuit breaker, but without actually switching it, and measuring and assessing this micro-motion, an active monitoring technique could be provided to monitor and prevent the system from degradation.

Figure 4:
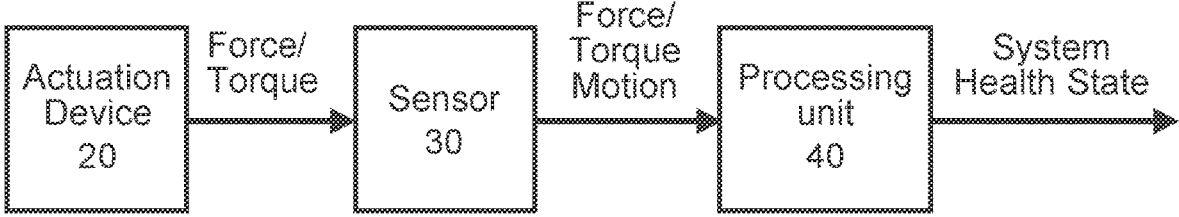
FIG. 4 shows a schematic representation of a monitoring system for a mechanically driven circuit breaker in accordance with the disclosure.

The new technique can be considered to involve three parts to realize an active system health monitoring of mechanically driven circuit breakers: First, an electromagnetic actuation device 20 is used that can exert a controlled force/torque to the system to initialize a micro motion that does move the system, but where this motion is small enough to not switch the circuit breaker. Second, a sensor 30 or sensing element is used which measures the motion that takes place. Third, a processing unit 40 or logical unit is used to assess whether the measured motion corresponding to a certain applied force/torque is sufficient to classify the system as being healthy. FIG. 4 shows a schematic of these three elements.

First a brief summary or overview is provided of the monitoring system.

1. Actuation Device 20
   a) Installation
      i. An additional (auxiliary) actuator device
      ii. A replacement of the state-of-the-art actuators
   b) Physical principle
      i. Electromagnetic design
      ii. Mechanical aspect
2. Sensor or Sensing Element 30
   a) Force/Torque measurement
      i. Measuring the applied voltage and current
      ii. Using an additional force/torque sensor
   b) Position/angle measurement
      i. Measuring the applied voltage and current
      ii. Measuring the induced voltage
      iii. Measuring the impedance
      iv. Using an additional position/angle sensor
3. Processing Unit or Logical Unit 40
   a) Actuator control
      b) Sensor data assessment
      These parts are now described in more detail.
1. Actuation Device 20
   a) Installation: The actuation device can either replace current actuators adding the micro-motion functionality within one device, that is also capable of initializing the normal switching, or be added to not actuate the opening/closing shaft under normal conditions, but solely for the micro motion.

b) Physical principle i. Electromagnetic Design

Electromagnetic actuators can be based on a variety of different working principles. Comparable to electric motors, it is possible to use induction, permanent magnets, the reluctance effect or similar effects and combinations of them.

The reluctance effect has some special advantages for the application of a micro motion and will therefore be exemplified in more detail. Some advantages are:

Contact free force transmission

No cogging force/torque

Fast actuation time

Electrical controllability

Cost effectiveness

The ability of torque and position sensing without additional devices

Figure 5:
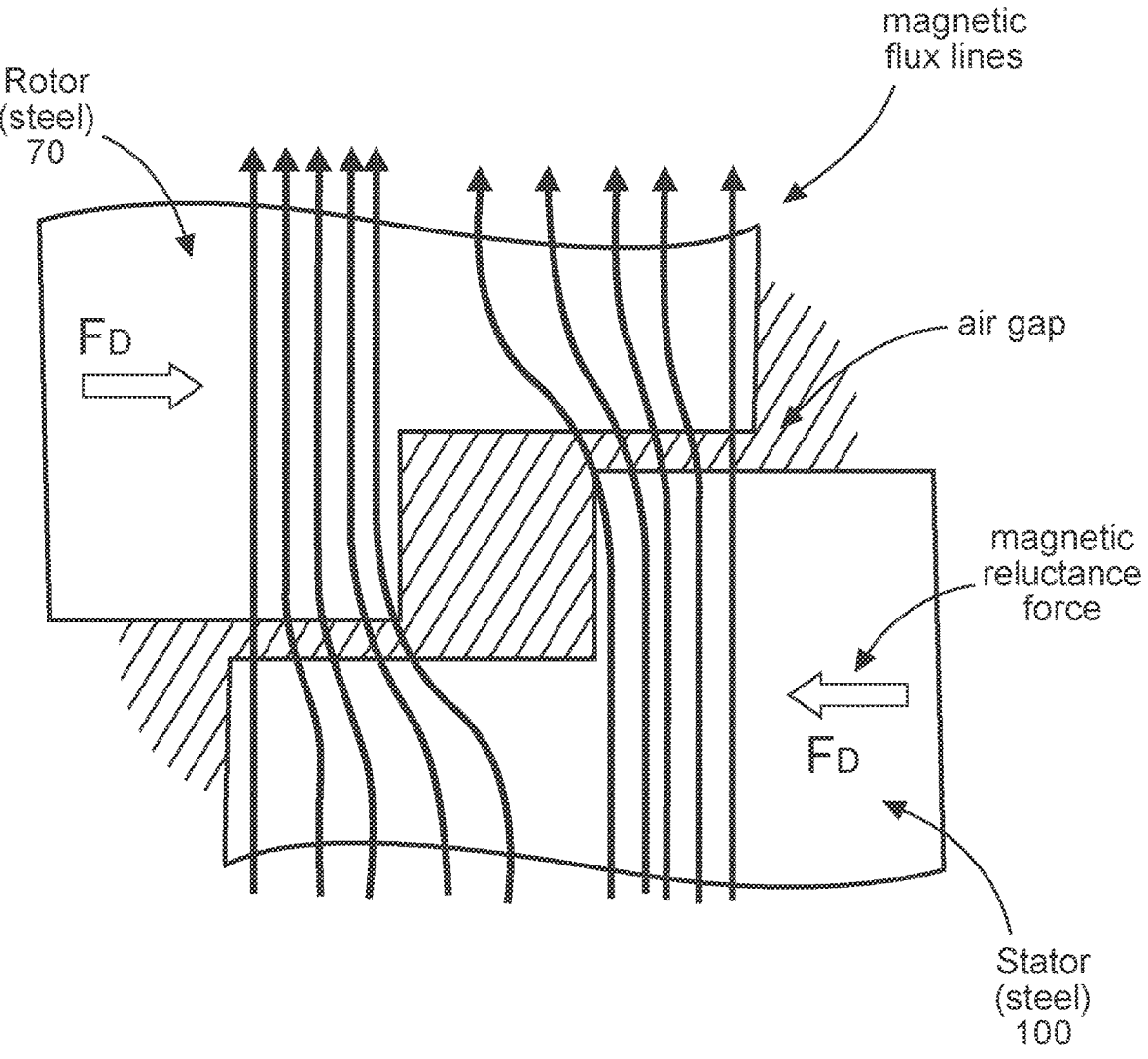
FIG. 5 shows an example of forces $F_g$ generated in an exemplar actuator device of an exemplar monitoring system for a mechanically driven circuit breaker in accordance with the disclosure.

Magnetic reluctance actuators are a special form of an electromagnetic actuator. Besides magnetic Lorentz Forces due to the interaction of a magnetic field and a current, Reluctance Forces (or -torque) come into play, when magnetic flux crosses an air gap in between ferromagnetic solids, which is changing in shape or width during the motion of the actuator. More illustrative, the reluctance force tends to minimize the resistance against the magnetic flux (that is the reluctance) to cross the air gap and thus minimize the magnetic energy. This is achieved, if the magnetic flux lines are as least distorted as possible when crossing the air gap. FIG. 5 shows a sketch of such a process that shows forces $F_R$ due to magnetic reluctance, where the rotor 70 and stator 100 of the actuation device 20 are shown, along with magnetic flux lines, air gap and the magnetic reluctance force $F_R$.

The reluctance effect is widely used in technological applications: reluctance motors, certain stepper motors or reluctance assisted synchronous machines are predominant examples. Furthermore, the principle is used to design actuators both for rotary and translatory motions with limited stroke.

Figure 6:
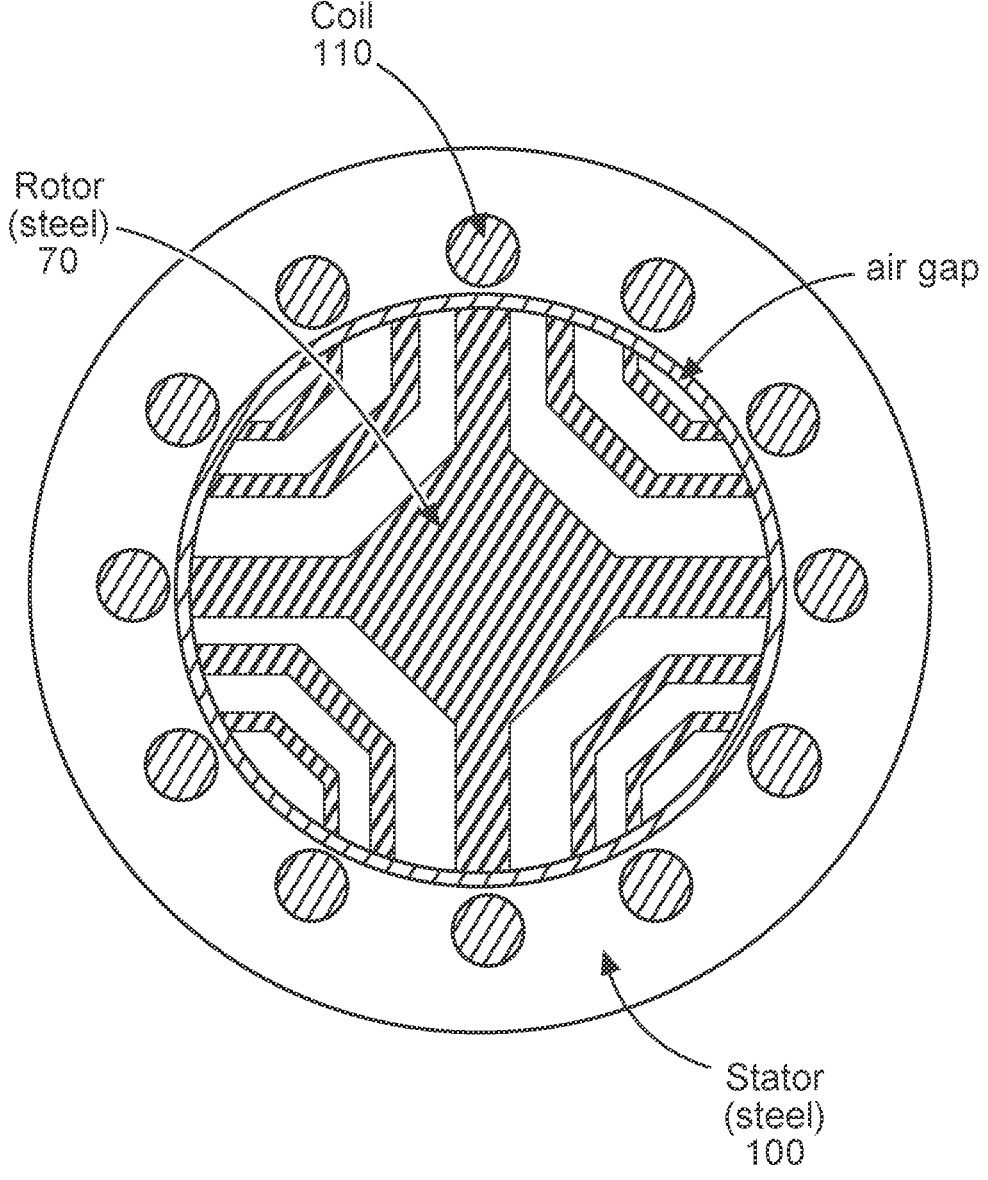
FIG. 6 shows an exemplar actuator device, in the form of a reluctance motor, of an exemplar monitoring system for a mechanically driven circuit breaker in accordance with the disclosure.
Figure 7:
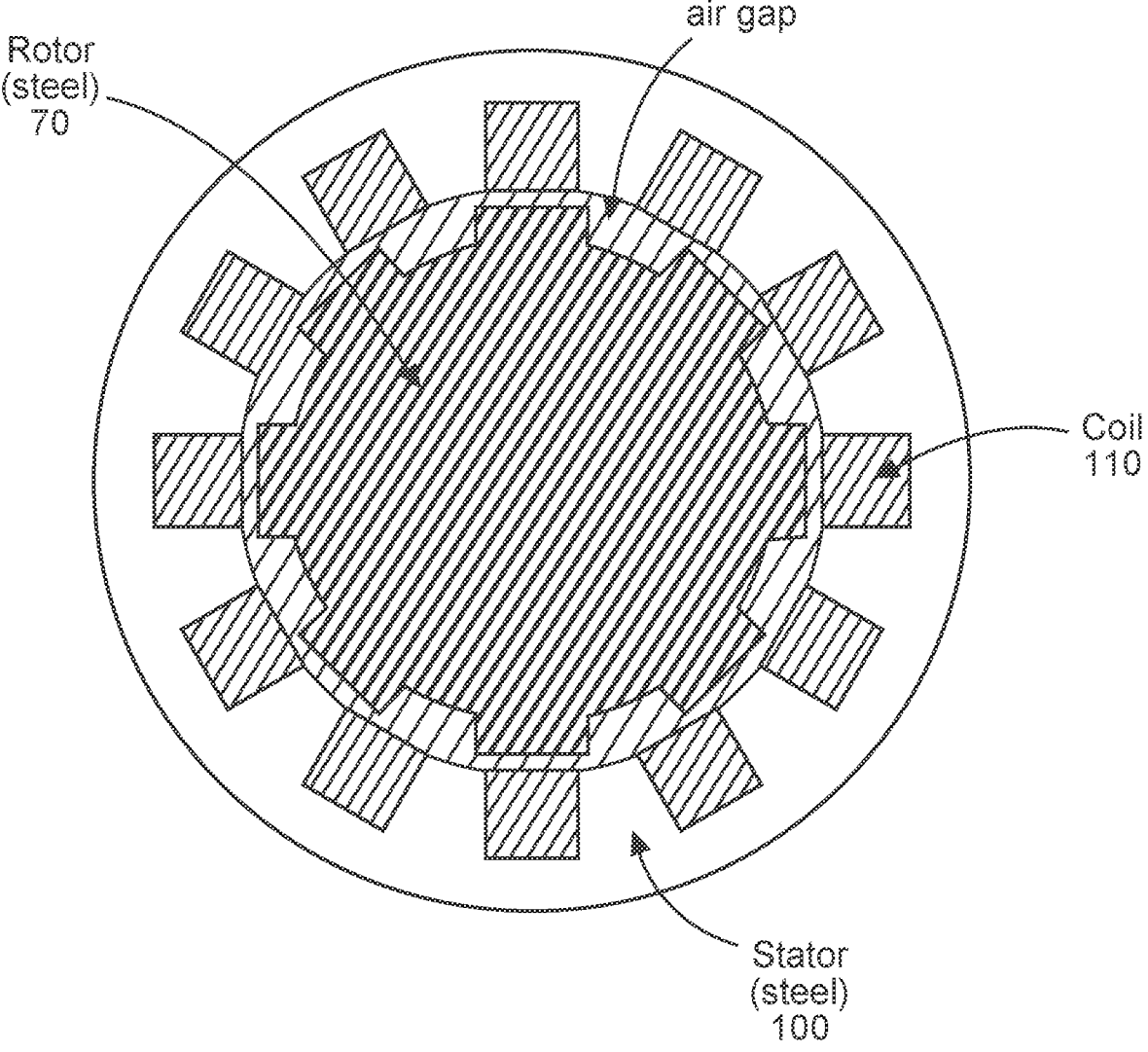
FIG. 7 shows an exemplar actuator device, in the form of a stepper motor, of an exemplar monitoring system for a mechanically driven circuit breaker in accordance with the disclosure.
Figure 8:
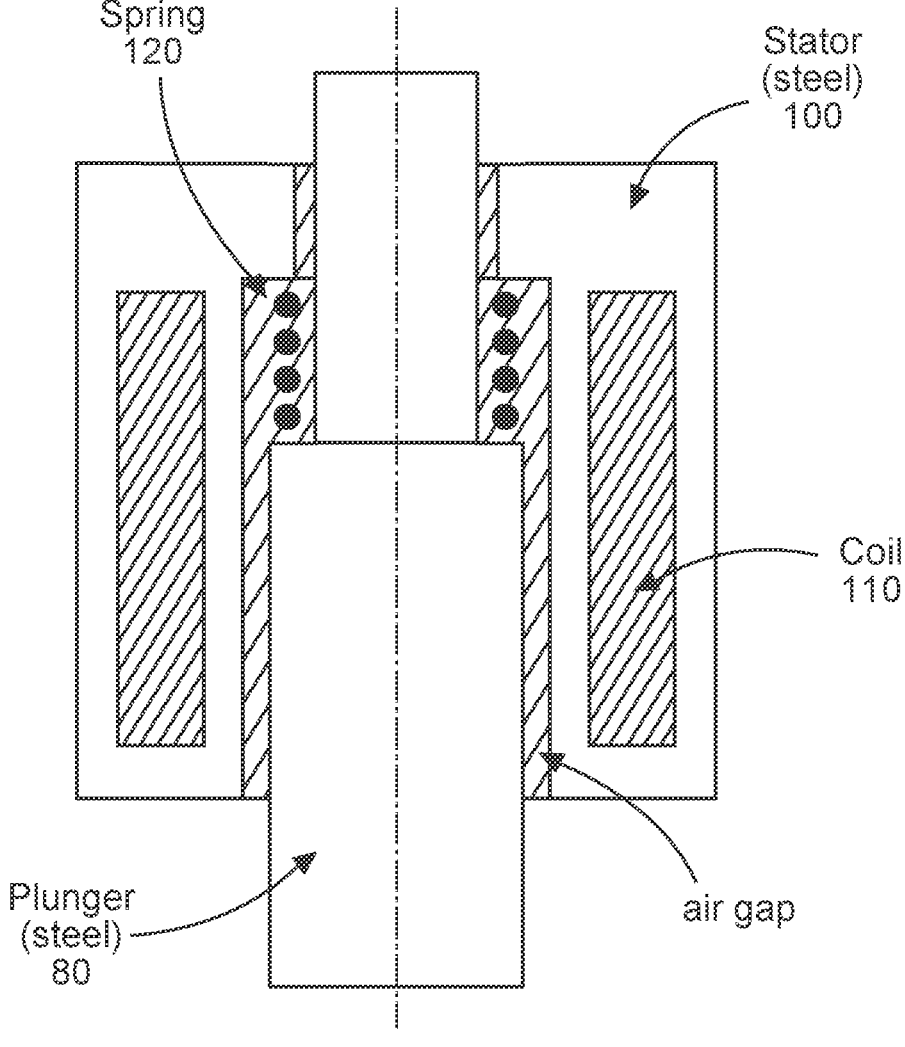
FIG. 8 shows an exemplar actuator device, in the form of a translator motor or actuator, of an exemplar monitoring system for a mechanically driven circuit breaker in accordance with the disclosure.

FIGS. 6-8 shows examples of actuation devices 20 suitable for utilization within the new monitoring system, where rotors 70, stators 100, plunger 80, coil 110, and spring 120 are shown with respect to different actuation devices, along with the air gap.

As an example, rotary reluctance actuators can enable both the normal circuit breaker operation with a rotation angle αA and a micro motion with an angle αM«αA. Furthermore, they are able to measure both the position/angle of the moving part and the applied force/torque in the actuator.

Such devices comprises several functional elements:

A magnetic actuation pole to perform the normal circuit breaker actuation.

A micro motion pole for the active health monitoring.

An element to perform the reset motion, which can either be a magnetic reset pole or a mechanical reset spring, or a combination of both.

Optional end stops to mechanically limit the motion and to provide for defined positions.

Figure 9:
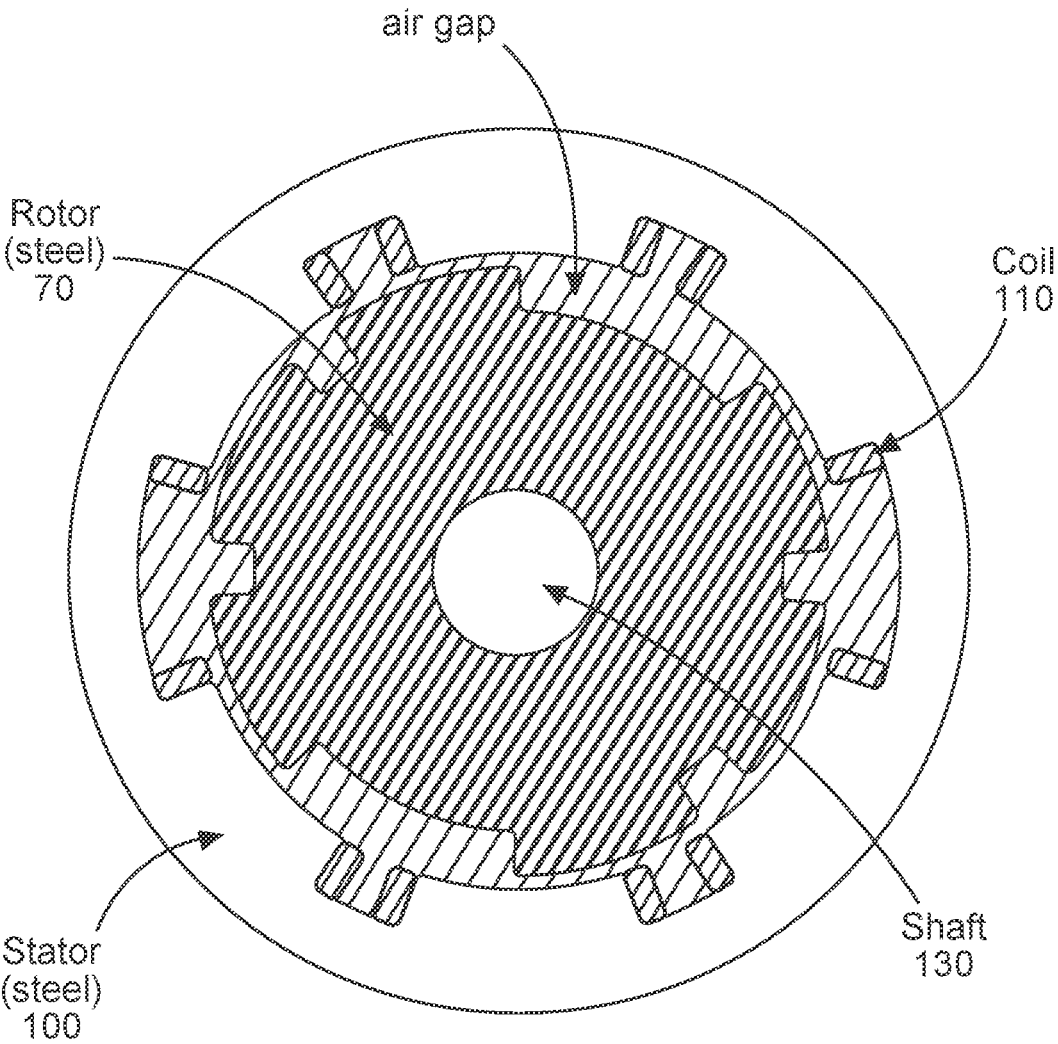
FIG. 9 shows a cross section through an exemplar actuator device of an exemplar monitoring system for a mechanically driven circuit breaker that has 3 poles, no end stops, and no reset spring in accordance with the disclosure.
Figure 10:
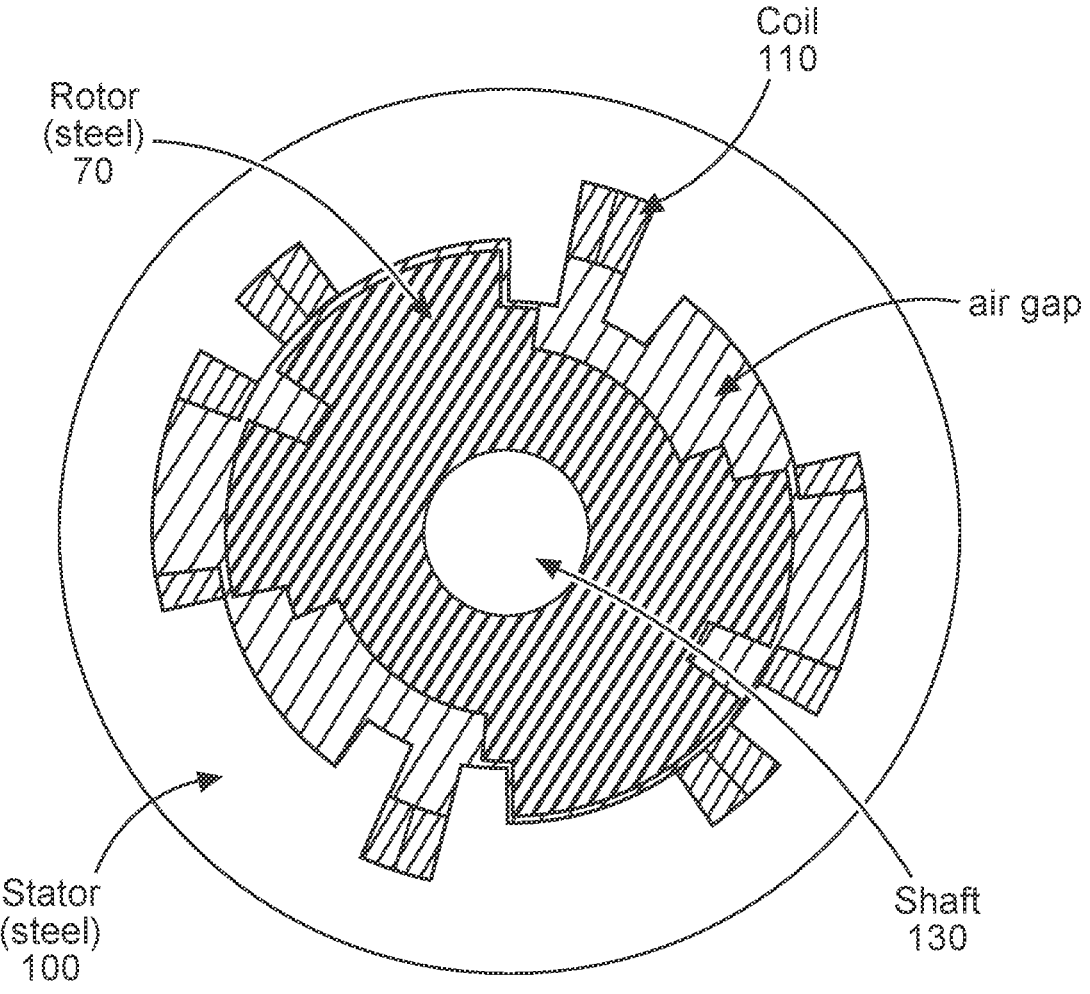
FIG. 10 shows a cross section through an exemplar actuator device of an exemplar monitoring system for a mechanically driven circuit breaker that has 2 poles, end stops, and reset spring in accordance with the disclosure.
Figure 11:
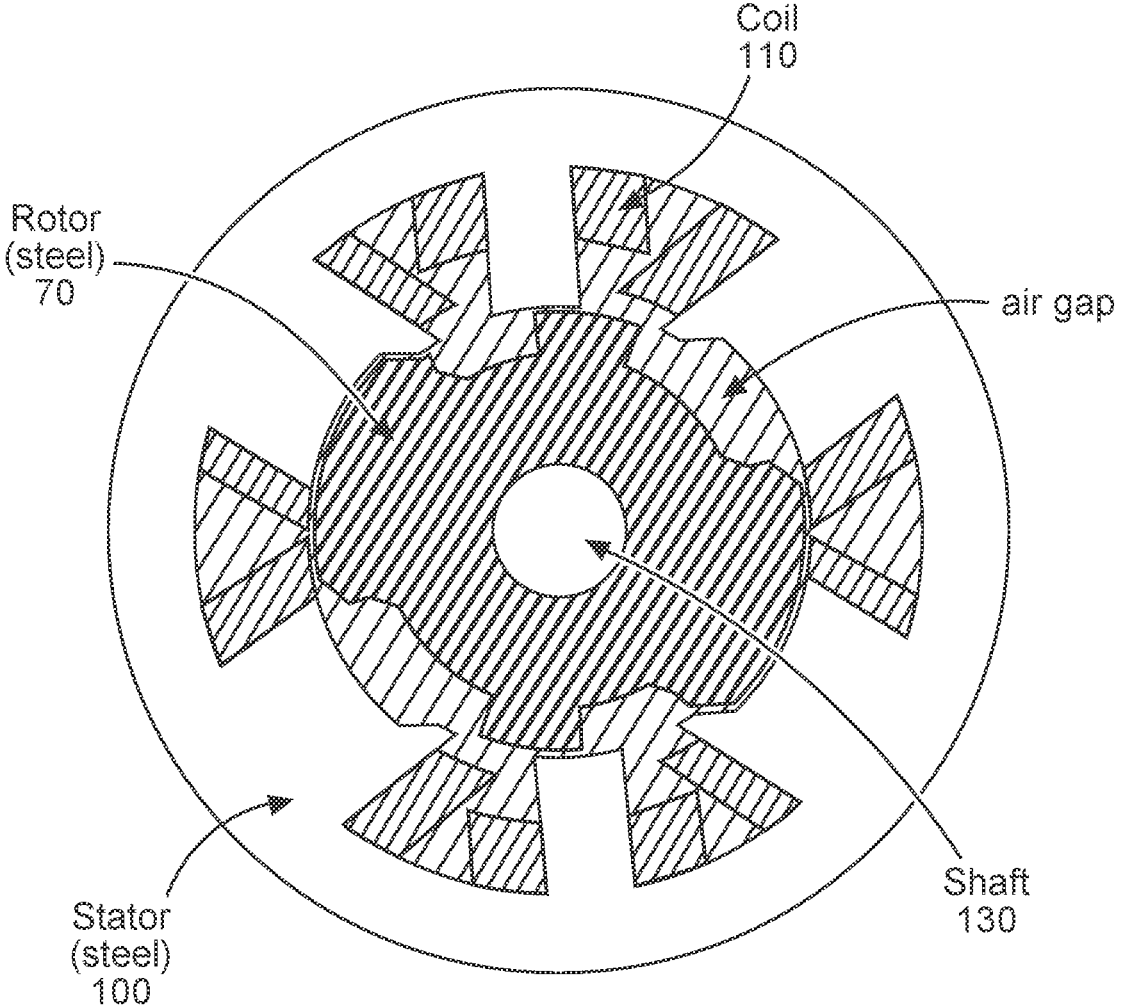
FIG. 11 shows a cross section through an exemplar actuator device of an exemplar monitoring system for a mechanically driven circuit breaker that has 3 poles, and reset spring in accordance with the disclosure.
Figure 12:
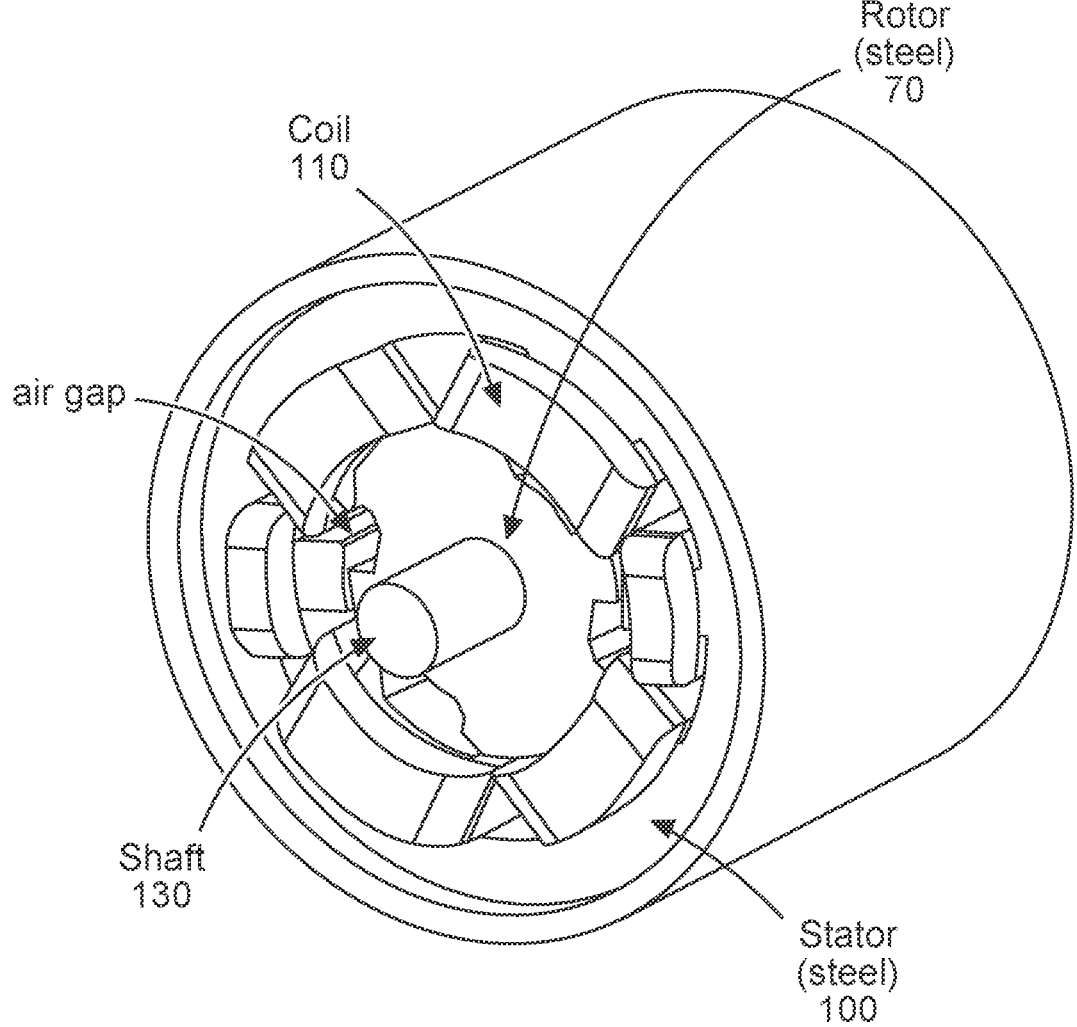
FIG. 12 shows a 3D representation of the actuator device of FIG. 11, where end shields and bearing for example are not shown.

The main part of reluctance actuator devices is built from a stator and rotor/plunger made from (soft) ferromagnetic material. The geometrical design of these elements is such, that there are two to three magnetic poles, where electric coils are attached to create a magnetic field. FIGS. 9-11 shows some exemplary cut sections through the axial direction of exemplar rotary actuator devices and FIG. 12 depicting an exemplary 3D view of the device in FIG. 11 with 2×3 symmetrical magnetic poles and corresponding coils.

ii. Mechanical Aspects

Reset Spring: A mechanical reset spring can replace the reset pole (FIG. 9 and FIG. 11) to passively bring the rotor back to its rest position or contribute to the torque created by a reset pole (as in FIG. 11)). There are different possible designs, as for example torsional helical springs, bending sheet metals etc.

End Stops: The end stops in the versions of FIG. 10 and FIG. 11 are optional but provide for defined actuation and rest positions of the system and may improve the hold torque of the actuator due to tangential magnetic flux components in the air gap.

Further relevant mechanical design aspects concern the design of end shields and corresponding bearings for the rotor/plunger, a fixation of the device towards its surroundings and a shaft connection to connect the rotor to the circuit breaker. These aspects can be make use of state of the art commercially available products (e.g. ball bearings, journal bearings, bellows couplings etc.)

2. Sensing Element

The sensing element is able to measure (or provide for an estimate of) both the applied force/torque and the current position/angle of the device. Both functionalities can either be integrated into the actuator or fulfilled by a dedicated sensor.

a) Force/Torque Measurement i. Measuring the Applied Voltage and Current

When measuring both voltage and current, the actuator force/torque can be estimated based on a flux-torque map.

ii. Using an Additional Force/Torque Sensor

An additional force/torque sensor can either be integrated to the actuator device or be placed externally to the device.

b) Position/Angle Measurement i. Measuring the Applied Voltage and Current

When measuring both voltage and current, the actuator position/angle can be estimated based on the current wave form.

ii. Measuring the Induced Voltage

The induced voltage can be measured in the energized phase, an un-energized phase or an additional sensing coil. Based on the induced voltage the actuator device position/angle can be estimated iii. Measuring the Impedance The impedance of an actuator coil or a dedicated sensing coil is a function of the actuator device position/angle. Thus, by measuring the impedance, the position/angle can be determined.

iv. Using an Additional Position/Angle Sensor

A dedicated position/angle sensor can either be integrated to the actuator device or be placed externally of the device.

3. Processing Unit or Logical Unit 40 a) Actuator Device Control

The actuator device control provides power to the actuator phases. It is connected to some power source (e.g. providing a DC voltage V0) and involves some switching elements, for example realized by transistors to control the current flowing through the actuator phases.

Figure 13:
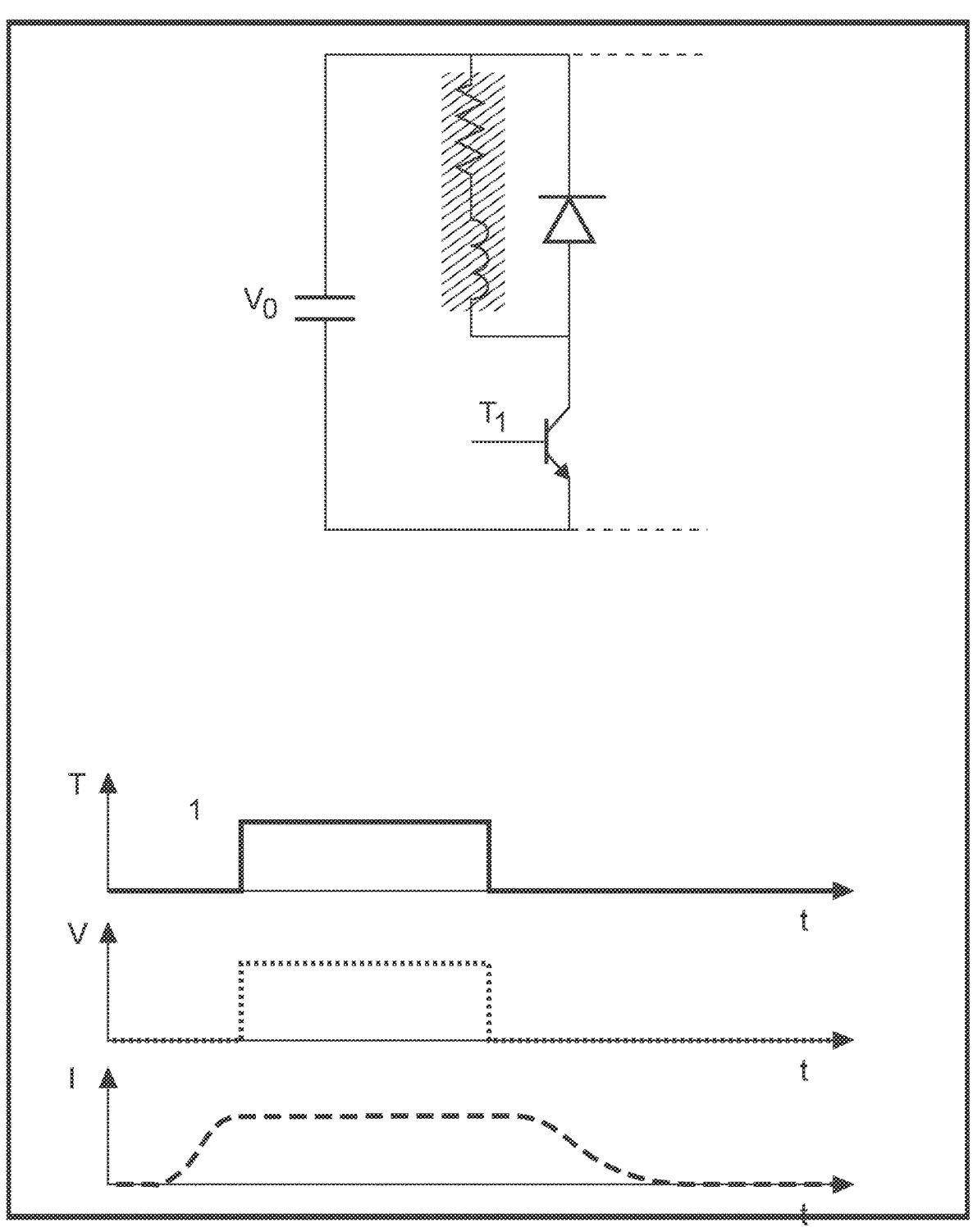
FIG. 13 shows a design for control of an actuator device with simple switching with 1 transistor and 2 diodes per phase in accordance with the disclosure.

FIGS. 13, 14 and 15 depict some possible topologies to activate and deactivate a certain phase.

FIG. 15 shows an example of an electronic unit for 3 phases using H-bridges including 2 transistors and 2 diodes for each phase.

Depending on the design, only positive (FIG. 13)), or positive and negative voltages (FIG. 14) and FIG. 15)) can be realized. This influences how fast the phase current can build up and thus influences the response time of the actuator which is an essential characteristic. Furthermore, if a full H-bridge as e.g. in FIG. 15) is used, both positive and negative currents can flow and the electronic unit can be used to also measure the phase inductance and thus the rotor position/angle.

b) Sensor Data Assessment

The processing unit logical unit evaluates the sensor data (force/torque and position/angle) using an appropriate algorithm to determine whether the system is considered healthy or not. This may involve a simple threshold for the position/angle value at a certain force/torque, or some more advanced algorithm such as a trained machine learning algorithm, using reference data for healthy and unhealthy main actuators.

In an example, the sensor data comprises rotational or linear movement data of the part of the main actuator.

In an example, the sensor data comprises force and/or torque data applied to the part of the main actuation.

In an example, the sensor data comprises force and/or torque data exerted by the actuation device.

In an example, the sensor data comprises rotational or linear movement data of at least one part of the actuation device.

In an example, the at least one part of the actuation device comprises a rotor of a rotational actuator or a plunger of a translational actuator.

In an example, the determination if the circuit breaker has a fault comprises utilization of reference sensor data.

In a second aspect, there is provided a monitoring system for a mechanically driven circuit breaker. The circuit breaker comprises a fixed contact and a movable contact and a main actuator. In a first state of the circuit breaker the moveable contact is spaced from the fixed contact and in a second state of the circuit breaker the moveable contact is in contact with the fixed contact. The main actuator is configured to transition the circuit breaker from the second state to the first state. The monitoring system comprises:

an actuation device;

at least one sensor; and processing unit.

The actuation device is configured to apply a micro-motion to a part of the main actuator involved in transitioning the circuit breaker from the second state to the first state without the circuit breaker transitioning from the second state to first state. The at least one sensor is configured to acquire sensor data associated with the application of the micro-motion to the part of the main actuator. The at least one sensor is configured to provide the sensor data to the processing unit. The processing unit is configured to determine if the circuit breaker has a fault. The determination if the circuit breaker has a fault comprises utilization of the sensor data.

In an example, the sensor data comprises rotational or linear movement data of the part of the main actuator.

In an example, the sensor data comprises force and/or torque data applied to the part of the main actuation.

In an example, the sensor data comprises force and/or torque data exerted by the actuation device.

In an example, the sensor data comprises rotational or linear movement data of at least one part of the actuation device.

In an example, the at least one part of the actuation device comprises a rotor of a rotational actuator or a plunger of a translational actuator.

In a third aspect, there is provided a monitoring method for a mechanically driven circuit breaker. The circuit breaker comprises a fixed contact and a movable contact and a main actuator. In a first state of the circuit breaker the moveable contact is spaced from the fixed contact and in a second state of the circuit breaker the moveable contact is in contact with the fixed contact. The main actuator is configured to transition the circuit breaker from the first state to the second state. The monitoring method comprises:

applying by an actuation device a micro-motion to a part of the main actuator involved in transitioning the circuit breaker from the first state to the second state without the circuit breaker transitioning from the first state to second state;

acquiring by at least one sensor data associated with the application of the micro-motion to the part of the main actuator;

providing by the at least one sensor the sensor data to a processing unit;

determining by the processing unit if the circuit breaker has a fault, wherein the determining if the circuit breaker has a fault comprises utilizing the sensor data.

In an fourth aspect, there is provided a monitoring method for a mechanically driven circuit breaker. The circuit breaker comprises a fixed contact and a movable contact and a main actuator. In a first state of the circuit breaker the moveable contact is spaced from the fixed contact and in a second state of the circuit breaker the moveable contact is in contact with the fixed contact. The main actuator is configured to transition the circuit breaker from the second state to the first state. The monitoring method comprises:

applying by an actuation device a micro-motion to a part of the main actuator involved in transitioning the circuit breaker from the second state to the first state without the circuit breaker transitioning from the second state to first state;

acquiring by at least one sensor data associated with the application of the micro-motion to the part of the main actuator;

providing by the at least one sensor the sensor data to a processing unit;

determining by the processing unit if the circuit breaker has a fault, wherein the determining if the circuit breaker has a fault comprises utilizing the sensor data.

The above aspects and examples will become apparent from and be elucidated with reference to the embodiments described hereinafter.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and "at least one" and similar referents in the context of describing the invention (especially in the context of the following claims) are to be construed to cover both the singular and the plural, unless otherwise indicated herein or clearly contradicted by context. The use of the term "at least one" followed by a list of one or more items (for example, "at least one of A and B") is to be construed to mean one item selected from the listed items (A or B) or any combination of two or more of the listed items (A and B), unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

What is claimed is:

1. A monitoring system for a mechanically driven circuit breaker, the circuit breaker comprising a fixed contact and a movable contact and a main actuator, wherein in a first state of the circuit breaker the moveable contact is spaced from the fixed contact and in a second state of the circuit breaker the moveable contact is in contact with the fixed contact, and wherein the main actuator is configured to transition the circuit breaker from the first state to the second state, wherein a closing shaft of the main actuator when activated enables the main actuator to operate a main shaft of the circuit breaker to transition the circuit breaker from the first state to the second state, and wherein the monitoring system comprises:

an actuation device;

at least one sensor; and a processing unit;

wherein the actuation device is configured to apply a micro-motion to the closing shaft of the main actuator involved in transitioning the circuit breaker from the first state to the second state without the circuit breaker transitioning from the first state to second state;

wherein the at least one sensor is configured to acquire sensor data associated with the application of the micro-motion to the closing shaft of the main actuator, wherein the sensor data comprises rotational movement data of the closing shaft of the main actuator;

wherein the at least one sensor is configured to provide the sensor data to the processing unit;

wherein the processing unit is configured to determine when the circuit breaker has a fault, wherein the determination when the circuit breaker has a fault comprises utilization of the sensor data.

2. The system according to claim 1, wherein the sensor data further comprises linear movement data of the part of the main actuator.

3. The system according to claim 1, wherein the sensor data comprises force and/or torque data applied to the part of the main actuation.

4. The system according to claim 1, wherein the sensor data comprises force and/or torque data exerted by the actuation device.

5. The system according to claim 1, wherein the sensor data comprises rotational or linear movement data of at least one part of the actuation device.

6. The system according to claim 5, wherein the at least one part of the actuation device comprises a rotor of a rotational actuator or a plunger of a translational actuator.

7. The system according to claim 1, wherein the determination of when the circuit breaker has a fault comprises utilization of reference sensor data.

8. A monitoring system for a mechanically driven circuit breaker, the circuit breaker comprising a fixed contact and a movable contact and a main actuator, wherein in a first state of the circuit breaker the moveable contact is spaced from the fixed contact and in a second state of the circuit breaker the moveable contact is in contact with the fixed contact, and wherein the main actuator is configured to transition the circuit breaker from the second state to the first state, wherein an opening shaft of the main actuator when activated enables the main actuator to operate a main shaft of the circuit breaker to transition the circuit breaker from the second state to the first state, and wherein the monitoring system comprises:

an actuation device;

at least one sensor; and a processing unit;

wherein the actuation device is configured to apply a micro-motion to the opening shaft of the main actuator involved in transitioning the circuit breaker from the second state to the first state without the circuit breaker transitioning from the second state to first state;

wherein the at least one sensor is configured to acquire sensor data associated with the application of the micro-motion to the opening shaft of the main actuator, wherein the sensor data comprises rotational movement data of the opening shaft of the main actuator;

wherein the at least one sensor is configured to provide the sensor data to the processing unit;

wherein the processing unit is configured to determine whether the circuit breaker has a fault, wherein the determination of whether the circuit breaker has a fault comprises utilization of the sensor data.

9. The system according to claim 8, wherein the sensor data comprises linear movement data of the part of the main actuator.

10. The system according to claim 8, wherein the sensor data comprises force and/or torque data applied to the part of the main actuation.

11. The system according to claim 8, wherein the sensor data comprises force and/or torque data exerted by the actuation device.

12. The system according to claim 8, wherein the sensor data comprises rotational or linear movement data of at least one part of the actuation device.

13. The system according to claim 12, wherein the at least one part of the actuation device comprises a rotor of a rotational actuator or a plunger of a translational actuator.

14. A monitoring method for a mechanically driven circuit breaker, the circuit breaker comprising a fixed contact and a movable contact and a main actuator, wherein in a first state of the circuit breaker the moveable contact is spaced from the fixed contact and in a second state of the circuit breaker the moveable contact is in contact with the fixed contact, and wherein the main actuator is configured to transition the circuit breaker from the first state to the second state, wherein a closing shaft of the main actuator when activated enables the main actuator to operate a main shaft of the circuit breaker to transition the circuit breaker from the first state to the second state, and wherein the monitoring method comprises:

applying by an actuation device a micro-motion to the closing shaft of the main actuator involved in transitioning the circuit breaker from the first state to the second state without the circuit breaker transitioning from the first state to second state;

acquiring, by at least one sensor, sensor-data associated with the application of the micro-motion to the closing shaft of the main actuator, wherein the sensor data comprises rotational movement data of the closing shaft of the main actuator;

providing by the at least one sensor the sensor-data to a processing unit; and determining by the processing unit whether the circuit breaker has a fault, wherein the determining whether the circuit breaker has a fault comprises utilizing the sensor-data.

15. A monitoring method for a mechanically driven circuit breaker, the circuit breaker comprising a fixed contact and a movable contact and a main actuator, wherein in a first state of the circuit breaker the moveable contact is spaced from the fixed contact and in a second state of the circuit breaker the moveable contact is in contact with the fixed contact, and wherein the main actuator is configured to transition the circuit breaker from the second state to the first state, wherein an opening shaft of the main actuator when activated enables the main actuator to operate a main shaft of the circuit breaker to transition the circuit breaker from the second state to the first state, and wherein the monitoring method comprises:

applying by an actuation device a micro-motion to a part of the main actuator involved in transitioning the circuit breaker from the second state to the first state without the circuit breaker transitioning from the second state to first state;

acquiring by at least one sensor sensor-data associated with the application of the micro-motion to the part of the main actuator, wherein the sensor data comprises rotational movement data of the opening shaft of the main actuator;

providing by the at least one sensor the sensor-data to a processing unit; and determining by the processing unit if the circuit breaker has a fault, wherein the determining if the circuit breaker has a fault comprises utilizing the sensor data.

* * * * *